United States Patent [19]

Narita et al.

[11] 4,057,825
[45] Nov. 8, 1977

[54] SEMICONDUCTOR DEVICE WITH COMPOSITE METAL HEAT-RADIATING PLATE ONTO WHICH SEMICONDUCTOR ELEMENT IS SOLDERED

[75] Inventors: Kazutoyo Narita; Tadashi Sakaue; Yuzi Niino, all of Hitachi, Japan

[73] Assignee: Hitachi, Ltd., Japan

[21] Appl. No.: 701,809

[22] Filed: July 1, 1976

[30] Foreign Application Priority Data

July 18, 1975 Japan .................................. 50-87293
Sept. 19, 1975 Japan .................................. 50-112623

[51] Int. Cl.² .................... H01L 23/02; H01L 23/28
[52] U.S. Cl. ........................................ 357/81; 357/72; 313/311; 165/80; 174/16 HS
[58] Field of Search ................... 313/311; 357/81, 72; 165/80; 174/16 HS

[56] References Cited

U.S. PATENT DOCUMENTS

| 2,484,311 | 10/1949 | Prakke et al. | 313/311 |
| 3,143,684 | 8/1964 | Miller | 313/311 |
| 3,449,506 | 6/1969 | Weinstein et al. | 357/81 |
| 3,922,712 | 11/1975 | Stryker | 357/81 |

*Primary Examiner*—Andrew J. James
*Attorney, Agent, or Firm*—Craig & Antonelli

[57] ABSTRACT

A semiconductor device has a composite metal heat-radiating plate consisting of, for example, two copper layers for serving as a thermally and electrically conducting medium and an iron layer for giving mechanical strength, interposed between the copper layers, in which the semiconductor element is directly or indirectly, electrically and mechanically coupled by soldering to one of the copper layers.

10 Claims, 9 Drawing Figures

SEMICONDUCTOR DEVICE WITH COMPOSITE METAL HEAT-RADIATING PLATE ONTO WHICH SEMICONDUCTOR ELEMENT IS SOLDERED

BACKGROUND OF THE INVENTION

1. Field of the Invention

The present invention relates to the structure of a heat radiator of a semiconductor device in which a metal heat radiator is directly or indirectly attached to one of the main surfaces of the semiconductor element.

2. Description of the Prior Art

It is customary in a semiconductor device having a small current capacity that a metal plate supporting the semiconductor element is used as a heat radiator. The semiconductor element is a diode pellet, a transistor pellet or a thyristor pellet.

In general, the semiconductor element is directly coupled to such a metal heat-radiating plate and then subjected to sealing process, or it is hermetically contained in a casing which is fixed to the metal heat-radiating plate.

A semiconductor device for treating current greater than a certain level has an electrode plate interposed between a semiconductor element and a metal heat-radiating plate and the electrode plate has a thermal expansion coefficient approximately equal to that of the semiconductor element, so as to prevent the break of the semiconductor element due to differences in thermal expansion. The semiconductor element is soldered to the electrode plate and the electrode plate is in turn soldered to the metal heat-radiating plate.

When a casing is used, the electrode plate is interposed between the ssemiconductor element and the casing.

The metal heat-radiating plate is used as one of the electrodes of the semiconductor element and must have a good electrical conductivity. It is a matter of course that the heat radiator plate is necessarily made of material having a high thermal conductivity for effectively dissipating heat. Moreover, the material should have a mechanical strength greater than a certain level and a good workability.

A conventional metal heat-radiating plate (heat sink) has been made of a single metal material, e.g. copper or iron.

A copper heat-radiating plate has a good heat conductivity (quality of heat dissipation) and workability, but it also has drawbacks of inferior mechanical strength and very high production cost. On the other hand, an iron heat-radiating plate has a sufficient mechanical strength and is advantageous in cost, but it has a poor heat conductivity. Thus, such a heat-radiating plate of a single metal material has drawbacks as well as advantages.

Especially, in case of a semiconductor device having a rather large current capacity and frequently undergoing heat cycling and mechanical vibration, e.g. a semiconductor full-wave rectifier used with a three-phase alternator in an automobile, the imperfectly designed matal radiator will cause, for example, thermal fatigue in the soldering material, which leads to the destruction of the semiconductor element.

SUMMARY OF THE INVENTION

One object of the present invention is to provide a semiconductor device with a metal heat-radiating plate excellent in mechanical strength and heat radiation efficiency.

Another object of the present invention is to provide a semiconductor device with a metal heat-radiating plate, which involves no increase in production cost.

An additional object of the present invention is to provide a semiconductor device with a metal heat-radiating plate having a good workability, to which a variety of semiconductor elements such as a diode, transistor or thyristor can be soldered.

The feature of the semiconductor device according to the present invention is that a semiconductor element is directly or indirectly, electrically and mechanically coupled to a composite metal heat-radiating plate consisting of two metal layers for serving as a thermally and electrically conducting medium and a metal layer for giving mechanical strength, interposed between the two metal layers.

BRIEF DESCRIPTION OF THE DRAWINGS

FIG. 1b is a partial cross sectional view of the semiconductor device shown in FIG. 1a.

FIG. 1c is a front view of the semiconductor device shown in FIG. 1a.

DESCRIPTION OF THE PREFERRED EMBODIMENTS

Figure 1A:
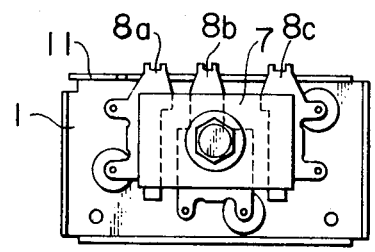
FIG. 1a is a top view of a semiconductor device as one embodiment of the present invention, which is used as a full-wave rectifier with a three-phase alternator for an automobile.
Figure 1B:
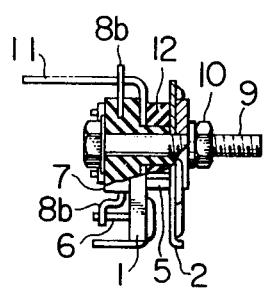
Figure 1C:
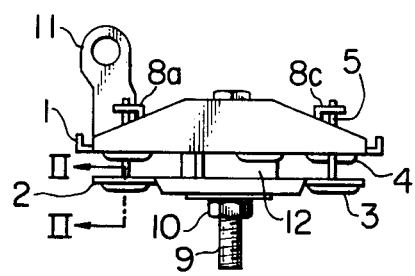

FIGS. 1a to 1c show a semiconductor device, as an embodiment of the present invention, used for full-wave rectification of an output of a three-phase alternator for use in an automobile, in which heat-radiating plates 1 and 2 of positive and negative electrodes are parallel disposed; the heat-radiating plates have portions 3 and 4 for receiving therein semiconductor elements; three diodes are disposed in and coupled to the receiving portions 3 of the plate 2 in one rectifying direction while three diodes are disposed in and coupled to the receiving portions 4 of the plate 1 in the opposite rectifying direction; and the diodes are covered with protective material. Three lead conductors 5 connected with the three diodes coupled to the heat-radiating plate 2 extend upwardly through perforations in the heat-radiating plate 1. These lead conductors 5 and three lead conductors 6 extending from the three diodes coupled to the heat-radiating electrode plate 1 are soldered to terminals 8a, 8b and 8c embedded in an insulating plate 7 so that the three-phase, full-wave rectifying bridge wiring may be completed.

The heat-radiating plates 1 and 2 are rigidly fixed by means of a bolt 9 and a nut 10, with an insulating plate 12 interposed therebetween. A three-phase a.c. input is applied to the terminals 8a, 8b and 8c and a resulting d.c. output is obtained between the bolt 9 and an output terminal 11 formed integrally of the heat-radiating plate 1.

Figure 2:
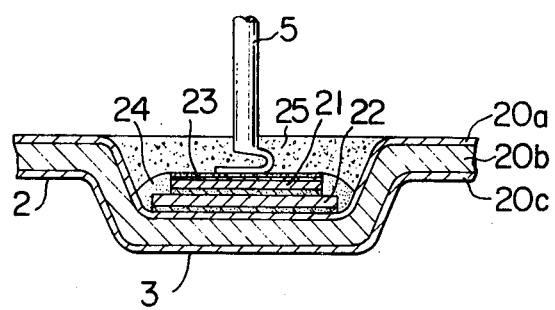
FIG. 2 is a longitudinal cross section showing a diode pellet and a portion receiving it, taken along line II—II in FIG. 1c.

FIG. 2 shows how the diodes are coupled to the heat-radiating plates 1 and 2.

The heat-radiating plate 2 is, according to the present invention, in the form of a composite plate consisting of a copper layer 20a, an iron layer 20b and a copper layer 20c, and the copper layers 20a and 20c are arranged on the both sides of the iron layer 20b for preventing bending of the heat-radiating plate 2 due to thermal expansion.

A diode pellet 21 has its bottom main surface provided with an electrode plate 22 of ferni, fernico, molybdenum or tungsten and the electrode plate 22 is soldered to the bottom of the receiving portion 3 of the heat-radiating plate 2.

The top main surface of the diode pellet 21 is covered with a nickel plating layer 23 to which the lead conductor 5 is soldered.

The side of the diode pellet 21 is covered with surface stabilizing agent 24 such as PTV and finally the receiving portion 3 is filled with hermetic molding material 25 such as silicon rubber.

The heat-radiating electrode plate 2 is fabricated by interposing an iron layer for providing mechanical strength between copper layers for serving as a heat dissipating medium and by pressing under heating the layers into a solid body. The thicknesses of the iron and copper layers are determined depending on the specification of the semiconductor device and its production cost.

The receiving portion having a depth of about 2 mm can be formed by pressing. Copper has a good malleability and ductility causes no break in the press forming.

The copper layers 20a and 20c may be plated with nickel or tin to prevent them from gathering rust.

It is not the iron layer but the copper layer that is arranged as each of the outer layers because copper has a good thermal conductivity and therefore offers good heat radiation.

Most of the heat generated by the diode pellet is transferred via the electrode 22 to the heat-radiating plate 2 and there the heat is diffused through the copper layer 20a to be dissipated.

Figure 3:
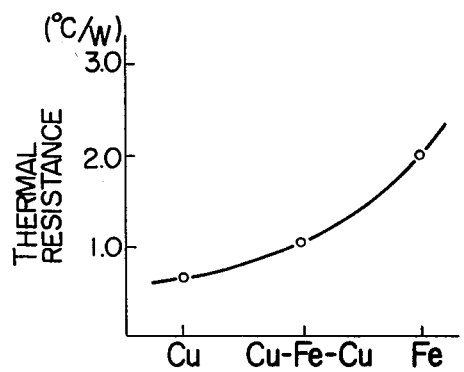
FIG. 3 shows the thermal resistances of heat-radiating plates of copper only, of Cu—Fe—Cu composite structure, and of iron only, respectively.

FIG. 3 shows the differences in thermal resistance among conventional heat-radiating plates of iron only and of copper only and a Cu—Fe—Cu composite heat-radiating plate according to the present invention. Each of these heat-radiating plates has a thickness of 1.2 mm, and the composite heat-radiating plate has copper layers each 0.2 mm thick and an iron layer 0.8 mm thick.

It is seen from FIG. 3 that the composite heat-radiating plate according to the present invention has a thermal resistance nearly equal to that of the heat-radiating plate of copper only and that it has an excellent heat radiation efficiency.

Figure 4:
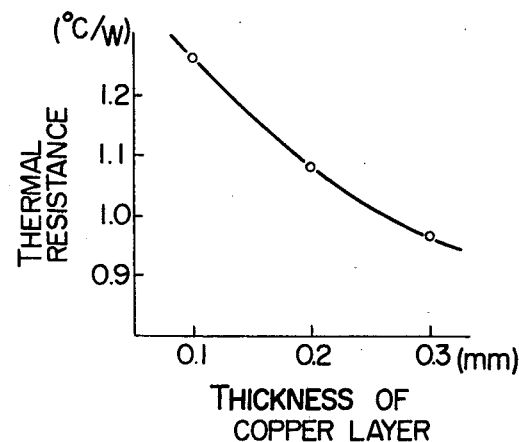
FIG. 4 shows the mode of variation in the thermal resistance of heat-radiating plate of Cu—Fe—Cu composite structure, according to the present invention, with the thickness of the copper layer varied.

FIG. 4 shows the variation of thermal resistance with change in the thickness of each of the copper layers 20a and 20c while the total thickness of the composite plate is kept to be 1.2 mm. It is seen there that the increase in the thickness of the copper layer causes a decrease in the thermal resistance and therefore a increase in the heat dissipating efficiency.

As a result of tests for estimating the useful life of the thus fabricated semiconductor device on the basis of the forward voltage drops of the diode pellets and the change in thermal resistance under actual mounting conditions where the temperature of the heat-radiating plate is changed from 50° to 170° C by rendering the output of the three-phase alternator in an automobile on for 2 minutes and off for the following 2.5 minutes, it has proven that the semiconductor device according to the present invention has almost the same useful life as a conventional one with a heat-radiating plate of copper only and about 1.5 times as long a useful life as a conventional one with a heat-radiating plate of iron only.

The cost of the composite heat-radiating plate 2 is indeed higher than that of the iron heat-radiating plate, but about half that of the copper heat-radiating plate..

Figure 5:
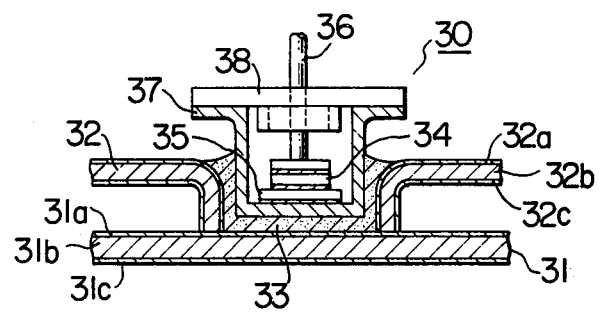
FIG. 5 is a longitudinal cross section of a casing-sealed type semiconductor device as another embodiment of the present invention.

FIG. 5 shows another embodiment of the present invention. In the figure, reference numeral 30 indicates a casing-sealed type diode device and a main composite heat-radiating plate 31 consisting of a copper layer 31a, an iron layer 31b and a copper layer 31c, according to the present invention is secured to the bottom surface of the diode device by a solder 33 while an auxiliary composite heat-radiating plate 32 consisting of a copper layer 32a, an iron layer 32b and a copper layer 32c is attached to the side surface of the diode device also by the solder 33.

The diode device 30 is constituted of a silicon diode pellet 34; an electrode plate 35 having almost the same coefficient of thermal expansion as silicon, soldered to the diode pellet 34; a lead conductor 36 provided on the diode pellet 34; a casing 37 with the electrode plate 35 fixed to the inner bottom wall thereof; and a seal 38 for hermetically taking the lead conductor 36 out of the casing 37.

With this structure, the heat generated by the diode pellet 34 is dissipated to the atmosphere by means of the main and the auxiliary heat-radiating plates 31 and 32 and therefore the current capacity can be improved to a great extent.

Figure 6A:
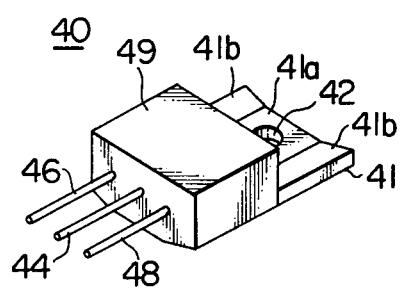
FIG. 6a is a perspective view of a resin-molded type thyristor as still another embodiment of the present invention.
Figure 6B:
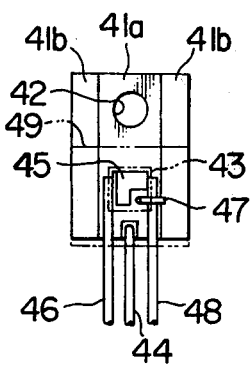
FIG. 6b is a top view of the thyristor shown in FIG. 6a, with its molding resin removed.

FIGS. 6a and 6b show still another embodiment of the present invention. The semiconductor device shown there is a resin-molded type thyristor 40. As seen in the figures, a Cu—Fe—Cu composite heat-radiating plate 41 consists of a flat portion 41a, having a perforation 42 for mounting, onto which a thyristor pellet 43 is attached, and non-contacting portions 41b on both sides of the flat portion 41a. The exposed portion of the PN junction of the thyristor pellet 43 is stabilized by passivation glass. The anode of the thyristor 40 is brought into contact with the flat portion 41a of the heat-radiating plate 41 and the cathode is disposed on the opposite side of the thyristor 40, i.e. on the upper side when viewed in the figure. The anode side main surface is plated with nickel. The thyristor pellet 43 is directly soldered to the electrode plate 41 by means of soldering material such as tin-lead alloy or aluminum. An anode lead conductor 44 is soldered to the heat radiating plate 41. A cathode electrode 45 is attached onto the cathode region of the thyristor pellet 43 and a cathode lead conductor 46 is soldered to the cathode electrode 45. A gate lead conductor 48 is connected via a bonding wire 47 with the gate region of the thyristor pellet 43.

The molding by epoxy resin 49 used in good contact with the heat-radiating plate 41 is applied onto that side of the plate 41 on which the thyristor pellet 43 is disposed, except that portion of the plate 41 where the mounting perforation 42 is provided.

The non-contacting portions 41b of the heat-radiating plate 41 are sloping at a certain angle with respect to the flat portion 41a and easily shaped by press forming.

In the heat-radiating plates shown in FIGS. 1, 2, 5 and 6, the iron layer for providing mechanical strength may be replaced by an aluminum layer. In that case, the aluminum layer is interposed between copper layers and the composite plate is formed by pressing under heating the three stacked layers, or copper layers may be formed on both sides of the aluminum layer by plating. The copper layers of the composite plate may be plated with nickel, as before, to prevent the copper from gathering rust. The heat-radiating plate having this structure diffuses the heat generated by the semiconductor pellet by means of the copper layers and a large heat radiation efficiency can be expected.

Since the electrical and the thermal resistances of aluminum are lower than those of iron, a copper-aluminum-copper composite heat-radiating plate is superior in heat radiation efficiency and electrical conductivity as compared to a copper-iron-copper composite heat-radiating plate.

The thicknesses of the aluminum and the copper layers are suitably determined depending on the specification of a semiconductor device to be fabricated and its cost.

The Cu—Al—Cu composite heat radiator is equal in heat radiation efficiency and electrical conductivity to a radiator of copper alone having the same shape and thickness, has a weight about one-third of that of a radiator of iron only having the same shape and thickness, and costs much the same as the iron radiator.

In the test for estimating the useful life of a semiconductor device for full-wave rectification of the output of a three-phase alternator in an automobile, the actual mounting condition is considered, that is, the three-phase output current is passed through the semiconductor device for two minutes and the current is interrupted for the following two and a half minutes and the temperature of the heat-radiating plate is changed from 50° to 170° C. As a result of such an estimation test, it has proved that the useful life of the semiconductor device having a Cu—Al—Cu composite heat-radiating plate according to the present invention is almost the same as that of a conventional semiconductor device having a heat-radiating plate of copper only and one half of a conventional semiconductor device having a heat-radiating plate of iron only.

The metal heat radiator according to the present invention, hitherto described is by no means limited to those described and shown in the attached drawings, but permits of various modifications and variations which the scope of the invention. Also, the radiator according to the present invention can be applied to various semiconductor pellets other than those described and shown in the drawings.

We claim:

1. A semiconductor device comprising a semiconductor element soldered to a metal heat-radiating plate, in which said metal heat-radiating plate consists of a first metal layer for providing mechanical strength and second metal layers disposed on both sides of said first metal layer, for serving as a thermal and electrical conducting medium, and said semiconductor element is soldered onto one of said second metal layers.

2. A semiconductor device as claimed in claim 1, in which said first metal layer is made of iron and said second metal layers are made of copper.

3. A semiconductor device as claimed in claim 1, in which said first metal layer is made of aluminum and said second metal layers are made of copper.

4. A semiconductor device comprising:
a semiconductor element; and
a metal heat radiating plate to which said semiconductor element is soldered, said plate consisting of a first metal layer for providing mechanical strength and a pair of second metal layers, serving as a thermal and electrical conducting medium, disposed on opposite sides of said first metal layer and having a thermal conductivity higher than that of said first metal layer, said semiconductor element being soldered onto one of said second metal layers.

5. A semiconductor device according to claim 4, in which said first metal layer is made of iron and said second metal layers are made of copper.

6. A semiconductor device according to claim 4, in which said first metal layer is made of aluminum and said second metal layers are made of copper.

7. A semiconductor device according to claim 4, wherein said metal radiating plate is configured to have a bottom portion and side wall portions contiguous therewith, said semiconductor element being soldered on said bottom portion.

8. A semiconductor device according to claim 4, further comprising a respective corrosion resistant metal layer disposed on each of said second metal layers.

9. A semiconductor device according to claim 8, in which said first metal layer is made of iron and said second metal layers are made of copper, and wherein
said corrosion resistant metal is one selected from the group consisting of nickel and tin.

10. A semiconductor device according to claim 8, in which said first metal layer is made of aluminum and said second metal layers are made of copper, and wherein
said corrosion resistant metal is one selected from the group consisting of nickel and tin.

* * * * *